United States Patent [19]

Endo

[11] Patent Number: 5,526,975

[45] Date of Patent: Jun. 18, 1996

[54] METHOD AND APPARATUS FOR DETECTING THE AMOUNT OF WIRE REMAINING IN A WIRE BONDER

[75] Inventor: Takashi Endo, Tokyo, Japan

[73] Assignee: Kabushiki Kaisha Shinkawa, Tokyo, Japan

[21] Appl. No.: 250,918

[22] Filed: May 31, 1994

[30] Foreign Application Priority Data

Jun. 2, 1993 [JP] Japan .................................... 5-154562

[51] Int. Cl.⁶ .................................................. B23K 37/00
[52] U.S. Cl. .............................. 228/103; 33/741; 33/750; 228/8; 242/223
[58] Field of Search ...................... 228/103, 8; 242/223, 242/309, 36, 49; 33/715, 732, 733, 740, 741, 750

[56] References Cited

U.S. PATENT DOCUMENTS

| | | | |
|---|---|---|---|
| 1,850,102 | 3/1932 | Grout | 33/750 |
| 2,166,852 | 7/1939 | Weiss | 33/750 |
| 4,572,421 | 2/1986 | Hug et al. | 228/103 |
| 5,277,354 | 1/1994 | Farassat | 228/8 |

FOREIGN PATENT DOCUMENTS 57-90363  6/1982  Japan ......................................  242/36

Primary Examiner—P. Austin Bradley
Assistant Examiner—Jeffrey T. Knapp
Attorney, Agent, or Firm—Koda and Androlia

[57] ABSTRACT

A method and apparatus are available for detecting the remaining amount of bonding wire on a wire spool of a wire bonder using a cam and detector switch so as to detect the number of revolutions of the wire spool which feeds out the bonding wire. A device for judging whether or not the number of revolutions detected by the detector switch has reached a preset number is linked to the detector switch. When the detected number of revolutions of the wire spool reaches the preset number, the rotation of the motor is stopped so as to stop the feed out of the wire.

12 Claims, 1 Drawing Sheet

METHOD AND APPARATUS FOR DETECTING THE AMOUNT OF WIRE REMAINING IN A WIRE BONDER

BACKGROUND OF THE INVENTION

1. Field of the Invention

The present invention relates to a method and apparatus for detecting the amount of wire remaining in a wire bonder or a wire bonding machine.

2. Prior Art

As well known, in wire bonders, a bonding wire is kept wound around a wire spool. The wire is led out so as to pass through a clamper, etc. and then inserted into a capillary which is moved in a Z direction (vertically up and down) and also in X and Y directions (horizontally in any direction). The wire fed out of the wire spool is thus connected between first and second bonding points.

In conventional wire bonders, the remaining amount of wire on the wire spool is detected by several different methods. In one method, the initial length of the wire wound around the wire spool is stored in an arithmetic unit, which is a computer, etc., and the amount of wire remaining is detected by calculations performed by the arithmetic unit based upon the amount of wire consumed. In another method, a stretch of wire is detected so as to know the remaining amount of wire. More specifically, the wire in the area between the wire spool and clamper, etc. is stretched out straight when the wire wound around the wire spool runs out. Thus, by detecting the stretch of the wire of the last turn, it is able to know that all the wire has run out.

In the first method, however, consumption of the wire is not calculated unless the wire is used and actually connected between two bonding points. Accordingly, if a part of the wire is used for wire adjustment purpose (and not for actual connection or "wiring") which occurs when a wire spool is replaced with a new one, an accurate measurement of the remaining wire is not accomplished. In the second method, the stretching out of the last turn of wire is detected. However, use of the stretched wire during the "wiring" causes undesirable wire looping, and the products that use the undesirable wire looping are undoubtedly defective products.

SUMMARY OF THE INVENTION

Accordingly, the object of the present invention is to provide a method and an apparatus for detecting the amount of wire remaining in a wire bonder so that an accurate determination of the amount of remaining wire is accomplished and defective products are avoided.

The method of the present invention for accomplishing the object is performed in a wire bonder in which a wire spool around which a wire is wound is rotated by a motor so that the wire is fed out to a capillary, and the method is characterized in that the number of revolutions of the wire spool is detected so that when the number of revolutions reaches a preset number of revolutions, the rotation of the motor revolving the wire spool is stopped.

The apparatus of the present invention for accomplishing the object is utilized in a wire bonder in which a wire spool around which a wire is wound is rotated by a motor so that the wire is fed out to a capillary, and the apparatus is characterized in that it comprises a detection means for detecting the number of revolutions of the wire spool and a judgment means for judging whether or not the number of revolutions of the wire spool detected by the detection means has reached a preset number of revolutions so that when the detected number of revolutions reaches the preset number of revolutions, the rotation of the motor is stopped.

In the method and apparatus of the present invention, the number of turns of wire wound around the wire spool is recorded and the number of revolutions of the wire spool is counted. Accordingly, the amount of wire released from the wire spoon for not only wiring but also for wire adjustment can be detected with high accuracy, and therefore, the amount of wire remaining on the wire spoon can always be accurately determined. In addition, since the amount of wire remaining is detected via the number of revolutions of the wire spool, the feed out of the wire can be stopped before the last turn of the wire is reached. Accordingly, defective products derived from the use of stretched wire can be prevented.

DETAILED DESCRIPTION OF THE INVENTION

Figure 1:
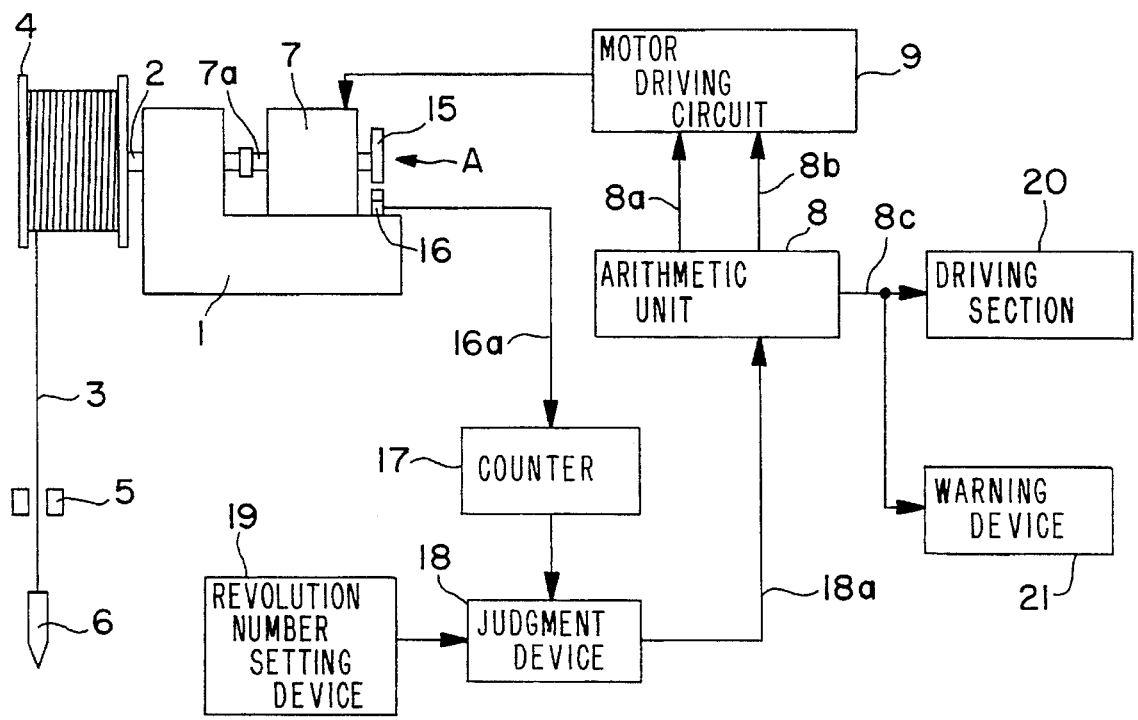
FIG. 1 is an illustration showing the system configuration of one embodiment of the present invention.

One embodiment of the present invention will be described below with reference to FIGS. 1 and 2.

A spool holder 1 of a wire bonder has a spool shaft 2 that is free to rotate. A wire spool 4 is detachably coupled to one end of the spool shaft 2. Wire 3 is wound around this wire spool 4. The wire 3 is led out when the wire spool 4 is rotated and guided to pass through a clamper 5 and then inserted into a capillary 6.

A motor 7 is installed on the spool holder 1, and the output shaft 7a of the motor 7 is connected to another end of the spool shaft 2. The motor 7 is driven by an arithmetic unit 8, which is a computer, etc. via a motor driving circuit 9.

Figure 2:
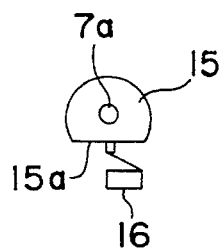
FIG. 2 is an end view of the cam used in the apparatus of the present invention viewed from the direction of arrow A in FIG. 1.

A cam 15 which has a cut-out 15a as seen in FIG. 2 is attached to the output shaft 7a of the motor 7, and a switch 16 is installed on the spool holder 1 so as to face the cam 15. The switch 16 is connected to a counter 17, and the counter 17 is connected to a judgment device 18 consisting of a comparator. Furthermore, a device 19 for setting the number of revolutions is connected to the judgment device 18.

In operation, a pre-counted number of revolutions, e.g., a number of turns one less than the number of turns of wire 3 wound around the wire spool 4 is set in the revolution number setting device 19. When the wire 3 is fed out to the capillary 6 from the wire spool 4, a rotation-amount control signal 8a is outputted from the arithmetic unit 8, and the motor 7 is driven the required amount via the motor driving circuit 9 so that the wire spool 4 is rotated accordingly. This wire feed out is performed in the same manner as in conventional bonders.

In the present invention, the switch 16 is used so that it outputs a revolution detection signal 16a to the counter 17 each time the wire spool 4 completes one revolution. In other words, each time the cam 15, which is connected to the wire spool 4 via the outputted shaft 7 of the motor 7 and the spool shaft 2, completes one revolution, the number of revolutions of the wire spool 4 is sent and stored in the counter 17. The judgment device 18 connected to the counter 17 then compares the number of revolutions counted by the counter 17 with the number of revolutions of the wire spool 4 set in the revolution number setting device 19.

If the number of revolutions counted by the counter 17 has not reached the number of revolutions set in the revolution number setting device 19, no signal is outputted from the judgment device 18, and an ordinary wire bonding is continued.

When the number of revolutions counted by the counter 17 reaches the number of revolutions set in the revolution number setting device 19, the judgment device 18 outputs a count-up signal 18a to the arithmetic unit 8 so that the arithmetic unit 8 outputs a "stop" signal 8b which stops the motor 7. At the same time, the arithmetic unit 8 also outputs a signal 8c. With this signal 8c, a driving section 20 of the bonder that moves the capillary 6 in the X and Y directions and also in the Z direction is stopped and also a warning is issued by the warning device 21.

As seen from the above, in the present invention the number of turns of wire wound around the wire spool 4 is designated and recorded in the revolution number setting device 19, and then the number of revolutions of the wire spool 4 is detected when the bonding is performed. Accordingly, not only the amount of wire used for wire adjustment but also the amount of wire used for wiring are detected. Thus, the amount of wire remaining on the wire spool can always be correctly determined.

Furthermore, the amount of wire remaining is detected by knowing the number of revolutions of the wire spool 4. Accordingly, the wire spool can be stopped before the last turn of wire is reached, so that defective products that includes looped wires caused by the stretching motion the wire can be prevented.

In the embodiment described above, the cam 15 and the switch 16 are used as a means for detecting the wire spool revolution. However, it would be possible to detect the number of revolutions of the wire spool 4 by a photo-sensor. Alternatively, it would also be possible to use a stepping or pulse motor equipped with an encoder as the driving source or the motor 7 so that the number of revolutions of the wire spool 4 is detected by the encoder.

In the present invention, the number of revolutions of the wire spool is detected, and the motor which drives the wire spool is stopped when this number of revolutions reaches a preset revolution number. Accordingly, the amount of wire remaining can be accurately determined, and the generation of defective products can be prevented.

I claim:

1. A method for detecting an amount of wire remaining on a wire spool in a wire bonder in which said wire spool around which a wire is wound is rotated by a motor so that said wire is fed out from said wire spool to a capillary, said method comprising:

detecting a number of revolutions of said wire spool, and stopping said motor when said detected number of revolutions of said wire spool reaches a preset number of revolutions corresponding to a number of turns of wire on said wire spool.

2. An apparatus for detecting an amount of wire remaining on a wire spool in a wire bonder in which said wire spool around which a wire is wound is rotated by a motor so that said wire is fed out from said wire spool to a capillary comprising: a spool revolution detection means which detects a number of revolutions of said wire spool, and a judgment means which judges whether or not said number detected of revolutions of said wire spool has reached a preset number of revolutions corresponding to a number of turns on said wire turns on said wire spool so that the rotation of said motor is stopped when said detected number of revolutions of said wire spool reaches said preset number of revolutions.

3. An apparatus for detecting an amount of wire remaining according to claim 2, wherein said spool revolution detection means comprises a cam connected to said motor and a switch means provided so as to face said cam.

4. An apparatus for detecting an amount of wire remaining according to claim 2, wherein said spool revolution detection means is a photo-sensor for counting a number of revolutions of said wire spool.

5. An apparatus for detecting an amount of wire remaining according to claim 2, wherein said motor is provided with an encoder for counting a number of revolutions of said wire spool.

6. An apparatus for detecting an amount of wire remaining on a wire spool used in a wire bonder that comprises:

a spool holder;

a spool shaft rotatably provided on said spool holder;

a wire spool coupled to one end of said spool shaft;

a motor provided on said spool holder, a motor shaft of said motor being connected to another end of said spool shaft so as to rotate said wire spool; and a motor driving circuit which activates said motor;

wherein said apparatus for detecting an amount of wire remaining comprising:

a detecting means for detecting a number of rotations of said wire spool through said motor shaft which is connected to said spool shaft;

a counter connected to said detecting means, said counter counting a number of rotations of said wire spool via said detecting means;

a judgment means connected to said counter, said judgment means being connected to said motor driving circuit; and a revolution number setting means connected to said judgment means, a number of turns of a wire wound on said wire spool is inputted in said revolution number setting means so that said number of turns of said wire inputted is compared by said judgment means with said number of rotations of said wire spool.

7. A method for detecting an amount of wire remaining in a wire bonder in which a wire spool around which a wire is wound is rotated by a motor so that said wire is fed out from said wire spool to a capillary, said method comprising: detecting a number of revolutions of said wire spool, stopping said motor when said number of revolutions of said wire spool reaches a preset number of revolutions and stopping movement of said wire bonder and issuing an alarm when said detected number of revolutions of said wire spool reaches said preset number.

8. A method according to claim 7, wherein said preset number is equal to one less than a number of turns of wife wound on said wire spool.

9. An apparatus for detecting an amount of wire remaining in a wire bonder in which a wire spool around which a wire is wound is rotated by a motor so that said wire is fed out from said wire spool to a capillary comprising: a spool revolution detection means which detects a number of revolutions of said wire spool, and a judgement means which judges whether or not said detected number of revolutions of said wire spool has reached a preset number of revolutions so that the rotation of said motor is stopped when said detected number of revolutions of said wire spool reaches said preset number of revolutions and wherein movement of said wire bonder is stopped and an alarm issued when said detected number of revolutions of said wire spool reaches said preset number of revolutions.

10. An apparatus according to claim 9, wherein said preset number is equal to one less than a number of turns of wire wound on said wire spool.

11. An apparatus for detecting an amount of wire remaining in a wire spool used in a wire bonder that comprises:
   a spool holder;
   a spool shaft rotatably provided on said spool holder;
   a wire spool coupled to one end of said spool shaft;
   a motor provided on said spool holder, a motor shaft of said motor being connected to another end of said spool shaft so as to rotate said wire spool; and
   a motor driving circuit which activates said motor; and wherein:
      said apparatus for detecting an amount of wire remaining comprises:
         a detecting means for detecting a number of rotations of said wire spool through said motor shaft which is connected to said spool shaft;
         a counter connected to said detecting means, said counter counting said number of rotations of said wire spool via said detecting means;
         a judgment means connected to said counter, said judgment means being connected to said motor driving circuit; and
      a revolution number setting means connected to said judgment means, a number of turns of a wire wound on said wire spool is inputted into said revolution number setting means so that said input number of turns of said wire is compared by said judgment means with said number of rotations of said wire spool;
      wherein movement of a wire bonder is stopped and an alarm issued when the number of rotations of said wire spool reaches said input number.

12. A apparatus according to claim 11, wherein said preset number is equal to one less than the number of turns of wire wound on said wire spool.

* * * * *